United States Patent [19]

Assel et al.

[11] Patent Number: 4,918,575
[45] Date of Patent: Apr. 17, 1990

[54] PROTECTIVE DEVICE FOR A WIRING FIELD OF A BACKPLANE OF A SUBASSEMBLY CARRIER

[75] Inventors: Eugen Assel, Knetzgau; Burkhard Dasbach, Erlangen; Bruno Gebhard, Forchheim, all of Fed. Rep. of Germany

[73] Assignee: Siemens Aktiengesellschaft, Berlin and Munich, Fed. Rep. of Germany

[21] Appl. No.: 264,215

[22] Filed: Oct. 28, 1988

[30] Foreign Application Priority Data

Oct. 30, 1987 [DE] Fed. Rep. of Germany .................. 87144964[U]

[51] Int. Cl.⁴ ............................................. H05K 9/00
[52] U.S. Cl. .................................. 361/424; 361/399; 439/718
[58] Field of Search ............... 439/55, 135, 607, 718; 174/35 R, 35 C; 211/41; 361/392, 395, 399, 412, 413, 415, 417, 419, 420, 424, 426, 428

[56] References Cited

U.S. PATENT DOCUMENTS

| | | | |
|---|---|---|---|
| 3,564,485 | 2/1971 | Cull ........................................ | 439/718 |
| 3,666,996 | 5/1972 | Brown .................................. | 361/426 |
| 3,904,936 | 9/1975 | Hamrick, Jr. ........................ | 439/718 |
| 4,180,305 | 12/1979 | Ustin .................................... | 439/718 |
| 4,271,455 | 6/1981 | McComas ............................. | 361/426 |
| 4,404,617 | 9/1983 | Ohyama ............................... | 174/35 R |
| 4,783,720 | 11/1988 | Joist ..................................... | 361/399 |

FOREIGN PATENT DOCUMENTS 1640511 8/1970 Fed. Rep. of Germany.
2813812 10/1979 Fed. Rep. of Germany.
3340334 5/1985 Fed. Rep. of Germany.

OTHER PUBLICATIONS

Publication Einbausystem ES 902 C 19-Zoll-Bauweise katalog ET 1.1, 8/87, (No Translation).

Primary Examiner—Gerald P. Tolin
Attorney, Agent, or Firm—Kenyon & Kenyon

[57] ABSTRACT

The invention relates to a protective device for the wiring field disposed on a backplane (8) of a subassembly carrier (2). According to the invention, a U-shaped lateral section (16) is provided, at the one leg (18) of which a strip-shaped fastening extension provided with cutouts (22) and to the other leg (26) of which a receptacle (28) provided with a longitudinal channel (30) are attached. The lateral parts (6) of the subassembly carrier (2) are detachably connected in the vicinity of the rear transverse bars (4) to a U-shaped lateral section (16) in such a manner that the U-shaped lateral sections (16) enclose the wiring field of the backplane (8). A wiring shield plate (32) folded longitudinally is connected detachably to the lateral sections (16) by fastening elements (34) via the receptacle (28) in such a manner that the wiring field of the backplane (8) is enclosed. Thereby, a protective device for a wiring field of a backplane (8) of a subassembly carrier (2) is obtained, in which the wiring shield plate (32) can be removed from the back side without disassembling the subassembly carrier (2).

9 Claims, 2 Drawing Sheets

PROTECTIVE DEVICE FOR A WIRING FIELD OF A BACKPLANE OF A SUBASSEMBLY CARRIER

BACKGROUND OF THE INVENTION

1. Field of the Invention

The invention relates to a protective device for a subassembly carrier, and more particularly to a protective device for a wiring field on a backplane of the carrier used for wiring.

2. Description of the Prior Art

A wiring shield plate for a backplane of a subassembly carrier is described in catalog ET 1.1 entitled "Assembly System ES 902 C, 19-inch Design" published by Siemens AG, 1987 Edition, order no. E 86010-K4101-A211-A1. This wiring shield plate is folded on all sides. The folds of the wiring shield plate at the end face contain captured nuts for ratchet screws. This wiring shield plate is screwed to the lateral parts of the subassembly carrier. One disadvantage of this wiring sheet plate is that due to the folding on all sides, a large storage and shipping volume is required. In addition, if the backplane of a subassembly carrier built into a cabinet or housing is to be repaired, this subassembly carrier must first be disassembled so that the wiring shield plate can be removed, or the subassembly carrier must be built into a cabinet or housing so that it is accessible from the side.

OBJECTS AND SUMMARY OF THE INVENTION

It is an object of the invention to describe a protective device for a wiring field of a backplane of a subassembly carrier, in which the wiring shield plate of a backplane of a subassembly built into a housing can be removed from a back side without disassembly of the subassembly carrier, and where the volume for storage and shipping is reduced considerably.

According to the invention, this problem is solved by providing a U-shaped lateral section. The section has one leg with a strip-shaped fastening extension provided with recesses attached at right angles to the leg. The other leg of the section has a receptacle provided with a longitudinal channel. The lateral parts of the subassembly carrier are connected in the vicinity of the rear transverse bars to the U-shaped lateral section detachably in such a manner that the U-shaped lateral profiles enclose the wiring field extending from the backplane. A longitudinally folded wiring shield plate is connected by fastening means, via the receptacles, detachably to the lateral section in such a manner that the wiring field of the backplane is enclosed on all sides.

This protective device for a wiring field of a backplane thus comprises two lateral sections and a wiring shield plate. The wiring shield plate is provided initially as a flat sheet for storage and for shipment to the customer and has preset bending points made by perforation. The wiring shield plate is shaped to its final form only during the installation of the protective device by simple folding by hand or by simple tools. Thereby, the volume for storage and shipping can be reduced considerably. In addition, openings can subsequently be punched in this flat wiring shield plate, through which connectors for the backplane are plugged.

It is a further advantage of this protective device that the wiring shield plate can be fabricated from a sheet metal plate or a coil strip. The lateral sections are cut by length from stock supplied by the yard. Thus, the parts of this protective device can be manufactured particularly economically.

It is a particular advantage of the protective device that the wiring shield plate can be connected detachably to the lateral sections through fastening means via the receptacle. Thus, the wiring shield plate is assembled only when the lateral sections are connected to a subassembly carrier. Since the fastening plane is arranged parallel to the backplane, the wiring shield plate can be disassembled from the rear. The lateral sections serve to protect furthermore the wiring field while the wiring shield plate is not assembled since the lateral sections are wider than the length of the pins.

In a further embodiment of the protective device, a lateral part of the subassembly carrier and the lateral section are each formed in one piece. Through this measure, additional fastening means and additional machining are eliminated. Thereby, the parts for a protective device are reduced to a flat metal sheet which is folded only shortly prior to the assembly. Thereby, the storage and shipping volume is reduced even more.

BRIEF DESCRIPTION OF THE DRAWINGS

For a further explanation of the invention, reference is made to the drawings in which the preferred embodiments a protective device for a wiring field of a backplane of a subassembly carrier constructed according to the invention are illustrated schematically.

DETAILED DESCRIPTION OF THE INVENTION

Figure 1:
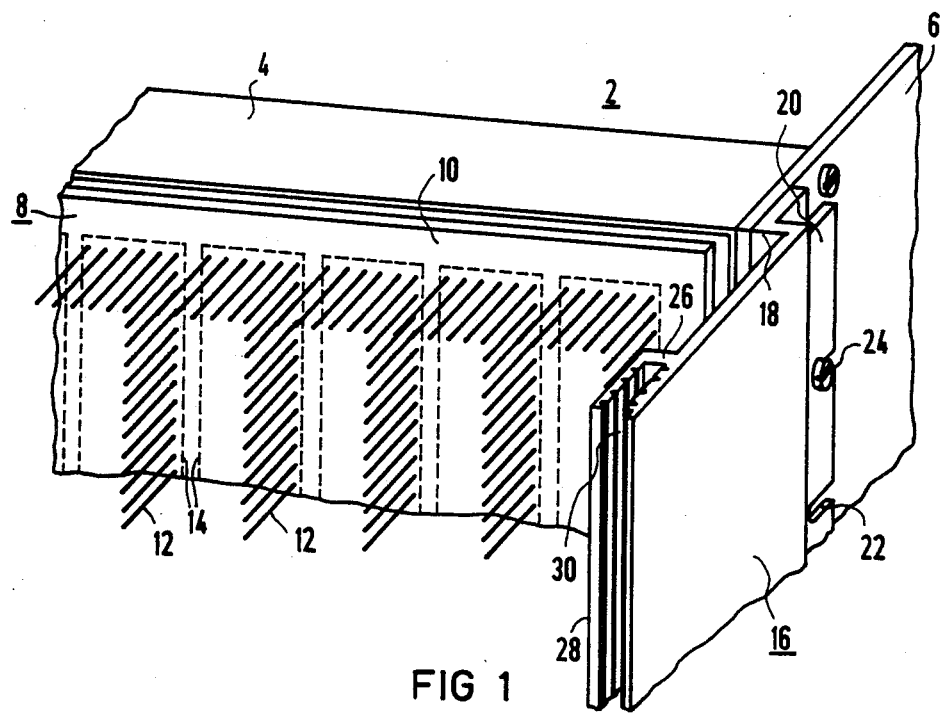
FIG. 1 shows a first embodiment of the protective device without a wiring shield plate.

FIG. 1 shows part of a subassembly carrier 2 of having an upper rear transverse bar 4, two opposed lateral parts 6 (only one being shown in the Figures) and a backplane 8 as shown. The backplane 8 is bolted to the transverse bars of the subassembly carrier 2. The side 10 of the backplane 8 facing away from the subassemblies contains a plurality of pins 12 partitioned into sets. Each set of these pins 12 extends backward from a plug-in connector which is attached on the opposite side of the backplane 8 facing the subassembly. The position of the plug-in connectors is indicated on the side 10 of the backplane 8 facing away from the subassemblies by phantom lines 14. The wiring field is used for wire-wrap wiring dependent on the particular subassemblies inserted into the subassembly carrier 2. For reasons of clarity, the wiring is not shown.

Each lateral part 6 of the subassembly carrier 2 is provided with a U-shaped lateral section 16. This lateral section 16 is made from extruded linear aluminum stock which is then cut to length as desired. The lateral section 16 can be precut in standard lengths incremented by discrete steps of, for instance, 25 mm so that it is adapted to any subassembly carrier height. A strip-shaped fastening extension 20 is attached to a leg 18 of the lateral section 16. This fastening extension 20 is provided with cutouts 22 which are distributed at regular spacings over the entire length of the fastening extension 20. The openings of the cutout 22 are facing away from the leg 18 of the U-shaped lateral section 16. This has the advantage that in the assemlby of the U-shaped lateral section 16 to the rear end of the lateral part 6 of the subassembly carrier 2, the lateral section 16 can be slipped on preassembled fastening means 24 which then need only be tightened. Another leg 26 of the U-shaped lateral section 16 is provided with a receptacle 28. This receptacle 28 has a longitudinal thread 30 with a plurality of parallel longitudinal grooves, which extends over the entire height of the subassembly carrier. This channel allows a screw to be fastened into the receptacle 28 at any point along its length. Therefore the dimensions of an object which is to be attached to the lateral section 16, are not fixed, whereby the manufacture of the object is more economical. The lateral sections 16 are connected to the lateral parts 6 of the subassembly carrier 2 in such a manner that the opening of the U-shaped section 16 always faces the wiring field of the backplane 8. In addition, the lateral sections 16 are wider than the lengths of the pins 12 of the wiring field. Thus, the lateral sections 16 fulfill a still further function, namely, the function of protecting the wiring field.

Figure 2:
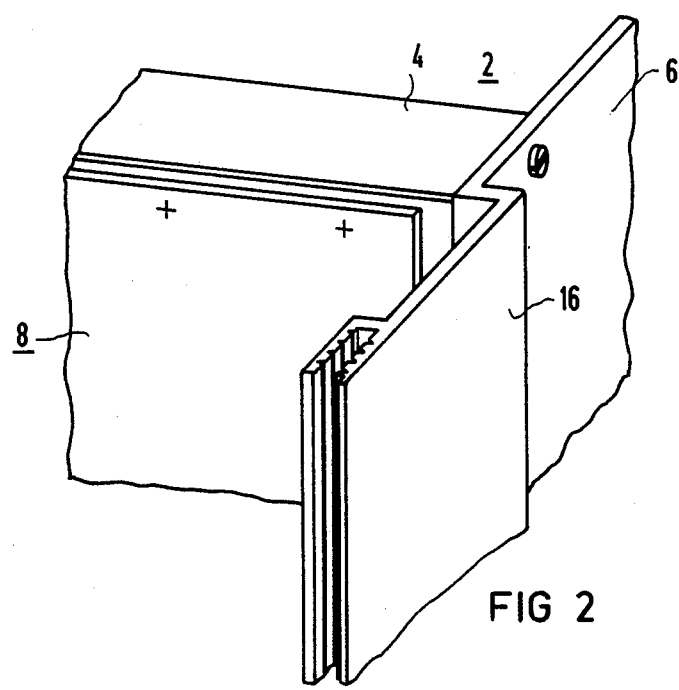
FIG. 2 shows a second embodiment of the protective device without a wiring shield plate.

In FIG. 2, a further embodiment of the protective device is shown, the wiring field being omitted for the sake of clarity. In this embodiment, the lateral parts 6 of the subassembly carrier 2 and the U-shaped lateral sections 16 are made in one piece. This saves additional fastening means and additional machining.

Figure 3:
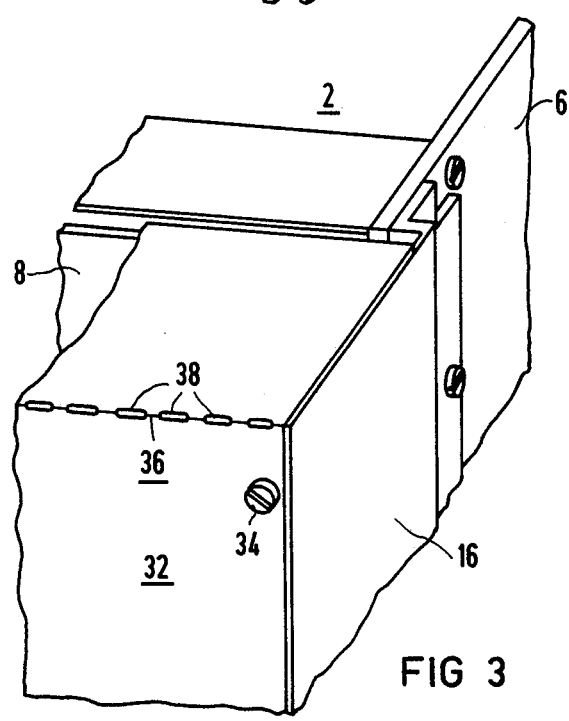
FIG. 3 illustrates a complete protective device.

In FIG. 3, a completely closed protective device for the wiring field of a backplane 8 of a subassembly carrier 2 is shown. A wiring plate 32 is connected here detachably to the lateral sections 16 by fastening means 34. The longitudinal edges 36 of plate 32 have perforation holes 38 which allow the plate to be folded along its long side. This wiring plate 32 is made of a sheet of metal or a coiled strip of sheet metal, such as aluminum. The desired bending line is defined by the perforations 38. These flat metal sheets which are provided with the beinding perforations, are brought into the final state only shortly prior to the assembly by folding by hand or by simple tools. In addition, the volume for storage and shipping is reduced substantially. After the wiring shield plate 32 is screwed to the longitudinal thread 30 of lateral side 16, interference signals are shielded from the pin field. In addition, this protection device protection provides to personnel and also indirectly for the components, against contact via the pins.

What is claimed is:

1. In a subassembly carrier which includes a transverse bar, two opposed lateral parts, a backplane and a wiring field of parallel pins disposed on and extending away from the backplane, a protective device comprising:
   at least one U-shaped lateral section, the U-shaped lateral section having a lateral portion and two legs extending transversely from opposite ends of the lateral section, a first one of the two legs being connected to one of the two opposed lateral parts, a second one of the two legs including a longitudinal receptacle having a longitudinal channel formed therein;
   a shield plate cooperating the the U-shaped lateral section to enclose and protect the wiring field, the shield plate being releasibly secured to the second one of the two legs; and
   a fastening means for detachably fastening the shield plate to the receptacle.

2. The protective device according to claim 1, wherein one said lateral part and said U-shaped lateral section are made in one piece.

3. The protective device of claim 1 wherein said first leg has a strip-shaped fastening extension with a plurality of cutouts (22) for fastening said lateral section to one said lateral part.

4. The protective device of claim 1, wherein the longitudinal channel has a plurality of parallel screw receiving grooves formed therein, the parallel grooves extending along the entire length of the longitudinal channel.

5. The protective device of claim 4, wherein the fastening means comprises at least one screw releasibly received in the screw receiving grooves formed in the longitudinal channel.

6. The protective device of claim 1, wherein the fastening means comprises screw means releasibly secured to the U-shaped lateral section.

7. The protective device of claim 1, wherein the shield plate is bent along a predetermined line so as to define two substantially transverse portions.

8. The protective device of claim 7, wherein the substantially transverse portions are substantially planar.

9. The protective device of claim 7 wherein both the substantially transverse portions are also substantially transverse with respect to the lateral portion of the U-shaped lateral section such that the transverse portions and lateral portion cooperate to protect the wiring field in three directions.

* * * * *